(12) United States Patent
Leason et al.

(10) Patent No.: US 10,235,870 B2
(45) Date of Patent: Mar. 19, 2019

(54) WIRELESS CONTROLLER

(71) Applicant: MHL Custom, Inc., Isabela, PR (US)

(72) Inventors: Nicholas Leason, Isabela, PR (US);
Mark B. Williams, Moss Beach, CA (US); Douglas Marsden, Marblehead, MA (US); Benjamin J. Beck, Boston, MA (US); Colby J. Higgins, Weymouth, MA (US)

( * ) Notice: Subject to any disclaimer, the term of this patent is extended or adjusted under 35 U.S.C. 154(b) by 0 days.

(21) Appl. No.: 15/483,795

(22) Filed: Apr. 10, 2017

(65) Prior Publication Data

US 2018/0293881 A1    Oct. 11, 2018

(51) Int. Cl.

| G05D 1/00 | (2006.01) |
| G08C 17/02 | (2006.01) |
| H05K 5/00 | (2006.01) |
| G01D 5/14 | (2006.01) |
| B63H 21/21 | (2006.01) |
| B63B 1/24 | (2006.01) |
| B63B 35/79 | (2006.01) |

(52) U.S. Cl.
CPC .............. G08C 17/02 (2013.01); G01D 5/145 (2013.01); G05D 1/0016 (2013.01); H05K 5/0017 (2013.01); B63B 1/248 (2013.01); B63B 35/7926 (2013.01); B63H 21/21 (2013.01)

(58) Field of Classification Search
CPC . B63B 1/248; B63B 35/7926; B63B 35/7943; B63H 5/14; B63H 21/17; B63H 21/21; B63H 1/16; B63H 11/04; G08C 17/02; G01D 5/145; H05K 5/0017; G05D 1/0016

See application file for complete search history.

(56) References Cited

U.S. PATENT DOCUMENTS

| 4,904,993 | A | * | 2/1990 | Sato | .................. | G07C 9/00182 |
| | | | | | | 340/12.5 |
| 6,388,559 | B1 | * | 5/2002 | Cohen | ................ | G07C 9/00182 |
| | | | | | | 318/283 |
| 6,636,197 | B1 | * | 10/2003 | Goldenberg | ............ | G05G 1/02 |
| | | | | | | 345/156 |
| 8,290,636 | B2 | | 10/2012 | Manning | | |
| 8,387,589 | B2 | | 3/2013 | Wong et al. | | |

(Continued)

FOREIGN PATENT DOCUMENTS

| CN | 204197261 | 3/2015 |
| CN | 204667632 | 9/2015 |

(Continued)

OTHER PUBLICATIONS

English machine translation of WO2015/033032 to Frankie Zapata, titled "Method and System for Multimode Control of an Actuator of a Unit from a Remote Instruction Device"; Dec. 3, 2015; 36 pages.*

(Continued)

*Primary Examiner* — Brian E Miller
(74) *Attorney, Agent, or Firm* — Eugenio J. Torres-Oyola; Victor M. Rodriguez-Reyes; Rafael Rodriguez-Muriel (57) ABSTRACT

Various examples of a waterproof wireless controller using a unique trigger mechanism with unique waterproofing characteristics are disclosed. The wireless controller can be used in watersports or other activities and be completely submerged without water intrusion or loss of function.

20 Claims, 4 Drawing Sheets

(56) References Cited

U.S. PATENT DOCUMENTS

| | | | |
|---|---|---|---|
| 8,851,947 B2 | 10/2014 | Vlock et al. | |
| 9,060,385 B1 | 6/2015 | Manning | |
| 9,199,772 B2* | 12/2015 | Krippendorf | B65D 55/12 |
| 9,607,506 B1* | 3/2017 | Manning | G08C 17/02 |
| 9,718,521 B2* | 8/2017 | Derrah | B63B 35/7943 |
| 2003/0167991 A1* | 9/2003 | Namanny | B63B 35/7926 |
| | | | 114/55.56 |
| 2004/0121700 A1* | 6/2004 | Derrah | A63H 13/045 |
| | | | 446/154 |
| 2004/0246733 A1* | 12/2004 | Liaw | B62J 6/00 |
| | | | 362/476 |
| 2005/0168373 A1* | 8/2005 | Mukaida | A63H 30/04 |
| | | | 341/176 |
| 2006/0094310 A1* | 5/2006 | Railey | B63B 35/7943 |
| | | | 440/38 |
| 2006/0229034 A1* | 10/2006 | Gizis | A63H 30/04 |
| | | | 455/95 |
| 2007/0200663 A1* | 8/2007 | White | A61B 5/117 |
| | | | 340/5.31 |
| 2007/0239992 A1* | 10/2007 | White | B60K 28/063 |
| | | | 713/186 |
| 2007/0283865 A1* | 12/2007 | Railey | B63B 35/7943 |
| | | | 114/55.58 |
| 2008/0259056 A1* | 10/2008 | Freier | G05D 23/1393 |
| | | | 345/184 |
| 2010/0274397 A1* | 10/2010 | Lozier | A62C 37/00 |
| | | | 700/283 |
| 2011/0201238 A1 | 8/2011 | Rott et al. | |
| 2011/0212691 A1* | 9/2011 | Rott | H04B 1/3827 |
| | | | 455/41.3 |
| 2012/0276794 A1* | 11/2012 | Mulligan | B63B 35/00 |
| | | | 441/80 |
| 2013/0157526 A1 | 6/2013 | Martin | |
| 2014/0084078 A1* | 3/2014 | Nelson | B05B 15/70 |
| | | | 239/69 |
| 2014/0134900 A1* | 5/2014 | Derrah | B63B 35/7943 |
| | | | 440/6 |
| 2014/0193017 A1* | 7/2014 | Fortin | H04R 1/021 |
| | | | 381/334 |
| 2016/0229510 A1* | 8/2016 | Aguirre | B63B 35/7943 |
| 2017/0297661 A1* | 10/2017 | Railey | B63B 35/7943 |
| 2018/0201346 A1* | 7/2018 | Young | B63B 35/7926 |

FOREIGN PATENT DOCUMENTS

| | | |
|---|---|---|
| JP | 2002154479 | 5/2002 |
| WO | WO-2015033032 A1 | 3/2015 |

OTHER PUBLICATIONS

English machine translation of JP2002-154479 to Kazunori, titled "Remote Control System and Transmitter of Motored-Surf Board"; May 28, 2002; 23 pages.*

"Wireless Electronic Kit's Manual", Zapata Racing—EMK Wireless Installation, 35 pgs.

* cited by examiner

WIRELESS CONTROLLER

FIELD OF THE DISCLOSURE

The present disclosure relates to a wireless electronic controller (e.g., for use in watersports).

BACKGROUND

Wireless electronic controllers can be used for throttle control of certain motorized vehicles. Yet, if such a motorized vehicle is used in or around water (e.g., during watersports), frequently any associated wireless controller is not suitable for such use. Indeed, it is a difficult task to provide a form factor that is familiar to users, such as a trigger in the case of a hand-held controller, while also ensuring that the components of the controller are safe from water damage during use.

It is therefore an object of the present disclosure to provide a wireless electronic controller that overcomes the above deficiencies.

SUMMARY

To better illustrate the system disclosed herein, a non-limiting list of examples is provided here:

A first example includes a wireless controller comprising a housing with a water-tight cavity, a computer comprising a processor and a memory disposed inside of the water-tight cavity, a wireless transmitter coupled to the computer, and a throttle mechanism comprising a sensor coupled to the computer and a trigger, wherein the sensor is disposed inside of the water-tight cavity and the trigger is disposed outside of the water-tight cavity. The computer can be configured to receive a first signal corresponding to movement of the trigger relative to the sensor, and in response to the first signal, direct the wireless transmitter to transmit a second signal configured to change the output of a motor that is wirelessly coupled to the wireless controller.

A second example includes a method of operating a waterproof controller comprising providing a waterproof controller comprising a housing with a water-tight cavity, a computer having a processor and a memory disposed in the water-tight cavity, and a throttle mechanism comprising a sensor coupled to the computer and a trigger, wherein the sensor is disposed inside of the water-tight cavity and the trigger is disposed outside of the water-tight cavity. The method can comprise wirelessly detecting movement of the trigger by way of the sensor, moving the trigger relative to the sensor, thereby causing the sensor to send a first signal to the computer, in response to the first signal, transmitting a second signal to a receiver coupled to a motor, and changing an output of the motor in response to the second signal.

A third example includes a wireless waterproof controller comprising a housing with a water-tight cavity, a computer comprising a processor and a memory disposed inside of the water-tight cavity, a wireless transmitter coupled to the computer, and a throttle mechanism comprising a Hall-effect sensor coupled to the computer and a trigger having a magnet, wherein the Hall-effect sensor is disposed inside of the water-tight cavity and the trigger and magnet are disposed outside of the water-tight cavity, the Hall-effect sensor being configured to wirelessly detect movement of the trigger when the magnet is moved relative to the Hall-effect sensor. The computer can be configured to receive a first signal corresponding to movement of the trigger and magnet relative to the Hall-effect sensor, and in response to the first signal, direct the wireless transmitter to transmit a second signal configured to change the output of a motor that is wirelessly coupled to the wireless controller.

BRIEF DESCRIPTION OF THE FIGURES

The above-mentioned and other features and advantages of this disclosure, and the manner of attaining them, will become more apparent and the disclosure itself will be better understood by reference to the following description of examples taken in conjunction with the accompanying drawings, wherein.

Corresponding reference characters indicate corresponding parts throughout the several views. The exemplifications set out herein illustrate examples of the disclosure, and such exemplifications are not to be construed as limiting the scope of the disclosure any manner.

DETAILED DESCRIPTION

In describing the examples of the disclosure illustrated and to be described with respect to the drawings, specific terminology will be used for the sake of clarity. However, the disclosure is not intended to be limited to any specific terms used herein, and it is to be understood that each specific term includes all technical equivalents.

The present disclosure is directed to a wireless waterproof controller 10 usable with motorized watersports equipment, including but not limited to the motorized hydrofoil watercraft(s) disclosed in U.S. Pat. No. 9,359,044, titled "Weight-Shift Controlled Personal Hydrofoil Watercraft", the disclosure of which is hereby incorporated by reference herein in its entirety. Wireless waterproof controller 10 uses a unique design to ensure that controller 10 is usable in circumstances where water is prevalent, such as in various motorized water sports activities.

Figure 3:
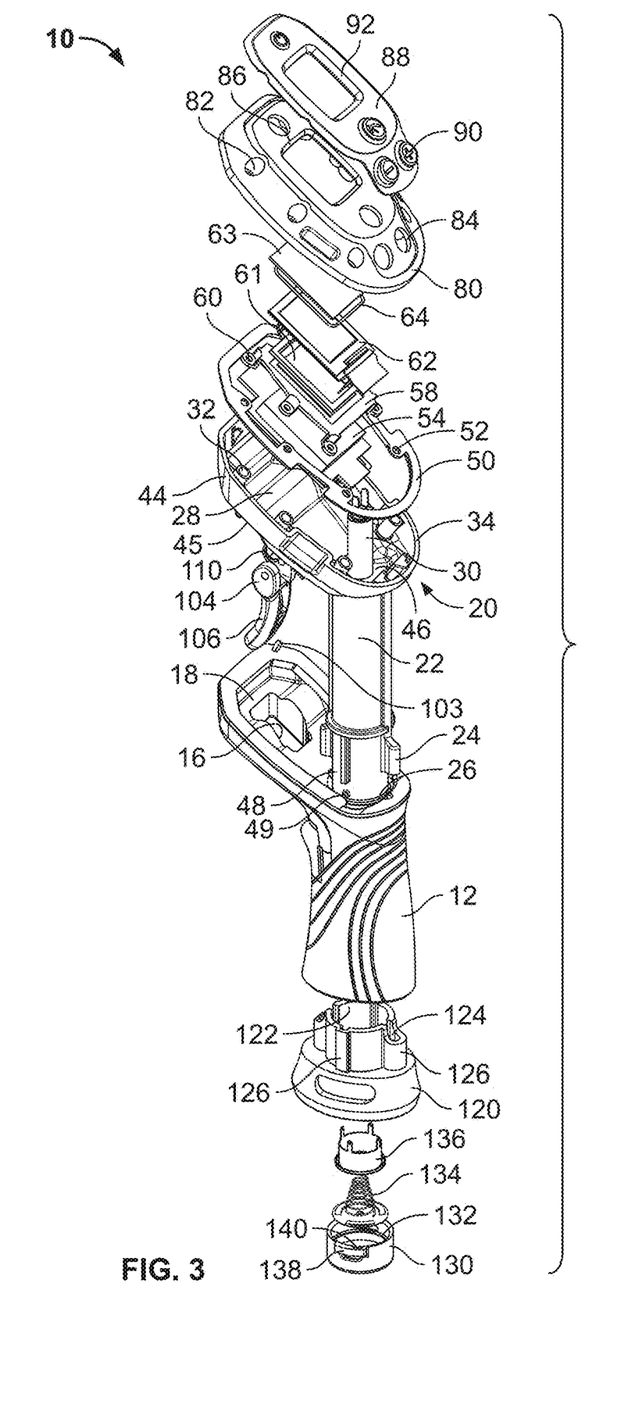
FIG. 3 is an exploded view of the components of the wireless controller of FIGS. 1-2.

Referring to FIG. 3, controller 10 can include a handle 12 provided for a user to grip controller 10. Handle 12 can have a grip bore 14, an opening 16, and cavity 18 for receiving a portion of a waterproof housing 20. In an example, grip bore 14 can have one or more (e.g., a plurality) of slots or recesses (not shown) sized and shaped to receive one or more (e.g., a plurality) of protrusions 24 on a shaft 22 of waterproof housing 20. As such, shaft 22 of waterproof housing 20 can be received in grip bore 14, such that waterproof housing 20 is substantially locked relative to handle 12 about a longitudinal axis extending through shaft 22. In other words, protrusions 24 of shaft 22 can be received in slots or recesses (not shown) grip bore 14 of handle 12 so that shaft 22 is substantially keyed into handle 12.

As illustrated, waterproof housing 20 can have a head 44 with a bottom surface 45 sized and shaped to seat within cavity 18 of handle 12. Further, waterproof housing 20 can have a shaft 22 that extends at a transverse angle to head 44, which includes a bore 42. In an example, bore 42 can define an opening 46 exposed to a water-tight cavity 28 of housing 20, and an opening 47 at a distal end section 48 of shaft 22 of housing 20. Distal end section 48 of shaft 22 can have protrusions 24 that extend along the longitudinal axis of shaft 22.

As shown in FIG. 3, a cap 120 can be provided with controller 10 for receiving a portion of shaft 22 of waterproof housing 20. For instance, cap 120 can have a bore 122 for receiving distal end section 48 of shaft 22 of waterproof housing 20. As illustrated, cap 120 can have one or more (e.g., a plurality) of slots or recesses 124 shaped to receive protrusions 24 of shaft 22 of waterproof housing 20. Further, recesses 124 can themselves define one or more (e.g., a plurality) of protrusions 126 designed to be received in slots or recesses (not shown) in grip bore 14 of handle 12. In this way, distal end section 48 of shaft 22 can be received in bore 122 of cap 120, and the interaction between protrusions 24 and recesses 124 can substantially rotationally lock shaft 22 relative to cap 120 about the longitudinal axis of shaft 22. And, cap 120 can be received in grip bore 14 of handle 12, where the interaction of protrusions 126 and the recesses (not shown) in grip bore 14 can substantially rotationally lock cap 120 relative to handle 12 about a longitudinal axis of handle 12. As such, with the above-discussed components assembled, shaft 22 of waterproof housing 20 can be substantially rotationally locked relative to handle 12 about the longitudinal axis of handle 12.

Still referring to FIG. 3, a second cap 130 is shown that can engage with cap 120 and/or shaft 22 of waterproof housing 20. Cap 130 can have a water-tight seal 132 (e.g., an O-ring), a spring 134 for use with a battery 30, and a cap insert 136, which in an example can provide an electrical lead(s) between battery 30 and other electronics inside controller 10. In an example, cap 130 can have one or more (e.g., a plurality) of bores or slots 138 for forming a bayonet-type lock with a portion of shaft 22 of waterproof housing 20. In addition, each slot 138 can have a small opening 148 that is sized to receive a bayonet protrusion 49 on shaft 22 of waterproof housing 20. For example, shaft 22 can include one or more (e.g., a plurality) of bayonet protrusions 49 that are insertable through small openings 148 and, with a twisting motion, bayonet protrusions 49 can translate along slots 138 of cap 130 to form a bayonet-type lock. When such a lock is established, water-tight seal 132 can become seated within a groove 26 on shaft 22 of waterproof housing 20, which can be sized to receive water-tight seal 132. Thus, cap 130 can be used to ensure a first section of shaft 22 of waterproof housing 20 is water-tight (e.g., a water-tight seal is formed between seal 132 and shaft 22 at groove 26). Of course, groove 26 could be omitted and seal 132 could simply engage shaft 22 in water-tight manner, or another sealing mechanism could be used to seal cap 130 to shaft 22 in a water-tight manner. In addition, in alternate examples, cap 130 can use other locking mechanisms besides a bayonet-type locking mechanism. For instance, cap 130 could be internally threaded and engage external threads on shaft 22, the inside of cap 130 could be tapered with a seal 132 and designed to press-fit on distal end section 48 of shaft 22 (which can itself be tapered), or other locking and sealing mechanisms can be used.

Figure 1:
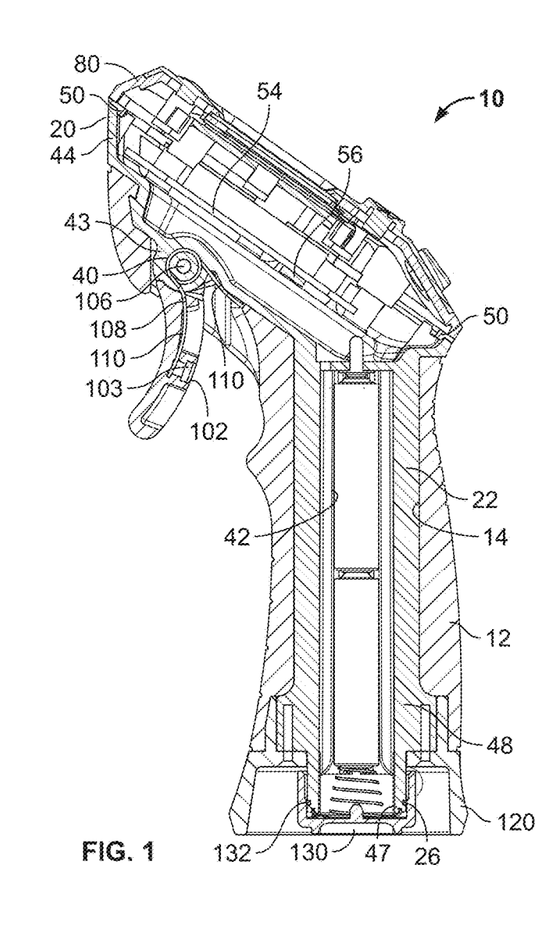
FIG. 1 is a side cross-sectional view of a wireless controller according to an example of the disclosure.

As shown in FIGS. 1 and 3, head 44 of waterproof housing 20 can have a cavity 28 that, during use, is water-tight so that various electronic components of wireless controller 10 can be shielded from water damage/intrusion. Surrounding cavity 28 can be one or more (e.g., a plurality) of holes 32 for receiving screws or other fixation members. Holes 32 can be threaded, in an example. In addition, a flange 34 that defines a substantially flat surface can encircle cavity 28 and, as detailed more fully below, engage with a water-tight seal 50 (e.g., a rubber gasket) to make cavity 28 water tight.

Various electronic components can be situated within cavity 28, including but not limited to a circuit board 54, a wireless proximity or distance sensor 56 (e.g., a Hall-effect sensor), and an electronic digital display 62. (e.g., an E-ink display). Further, different mounting components and waterproofing components for such electronics can be included with controller 10, as described below.

In an example, circuit board 54 can include a wireless transmitter (e.g., a Bluetooth transmitter), and it can be mounted on an underside of a mount 58. For instance, the underside of mount 58 can include a cavity that receives circuit board 54 and securely retains circuit board 54. In addition, mount 58 can include one or more (e.g., a plurality) of tabs 60 each with an opening for receiving a screw or other fixation member, and an upper surface of mount 58 can have a cavity 61 sized to receive and secure digital display 62. A protective transparent screen 63 can also be arranged above digital display 62, and can cover display 62 to protect display 62 and, in certain examples, assist with waterproofing display 62. For instance, a water-tight seal 64 can be provided around transparent screen 63, which can engage with an edge of a window 86 of face plate 80 and/or display 62 to establish a water-tight seal at the location of window 86. Thus, transparent screen 63 can provide a mechanism for viewing display 62, and water-tight seal 64 can seal transparent screen 63 along the edge of window 86 so that water cannot enter controller 10 at that area. As with the other water-tight seals of the disclosure, water-tight seal 64 can be a rubber, polymer, thermoplastic, elastomer, or another water-tight gasket.

As shown in FIG. 3, wireless controller 10 can also include a face plate 80 that can engage with waterproof housing 20 to establish a water-tight cavity for the above-described electronic components. Face plate 80 can have holes 82 for receiving screws or other fixation members (not shown) that can align with holes 32 of waterproof housing 20. Further, water-tight seal 50 can be disposed between faceplate 80 and waterproof housing 20, with its holes 52 in alignment with holes 82 of faceplate 80, holes 60 of mount 58, and/or holes 32 of waterproof housing 20. In this way, screws or other fixation members can be inserted through holes 82 of faceplate 80, into and through holes 60 of mount 58, into and through holes 52 of water-tight seal 50, and into holes 32 of waterproof housing 20. Such screws or other fixation members can then be tightened (e.g., holes 32 of waterproof housing 20 can be threaded) to cause water-tight seal 50 to engage with flange 34 of waterproof housing 20 and a perimeter of faceplate 80 so that a water-tight seal is formed between housing 20 and faceplate 80 along the entire interface perimeter thereof. This seal is also shown, for example, in FIGS. 1-2. In addition, as holes 52 of water-tight seal 50 can be aligned with holes 82 of faceplate 80, holes 60 of mount 58, and/or holes 32 of waterproof housing 20, portions of seal 50 can surround such holes and form a water-tight seal at the interface of the holes to ensure that water cannot enter controller 10 (e.g., through holes 82 of faceplate 80). Thus, the engagement of faceplate 80 and waterproof housing 20 can create a water-tight cavity in the inside of controller 10 that protects all the electronic components from water intrusion/damage. In addition, as described previously, the interaction between water-tight seal 132 and groove 26 can prevent water intrusion at the bottom of controller 10. As such, controller can be entirely water-tight for use in, as an example, watersports activities.

Figure 2:
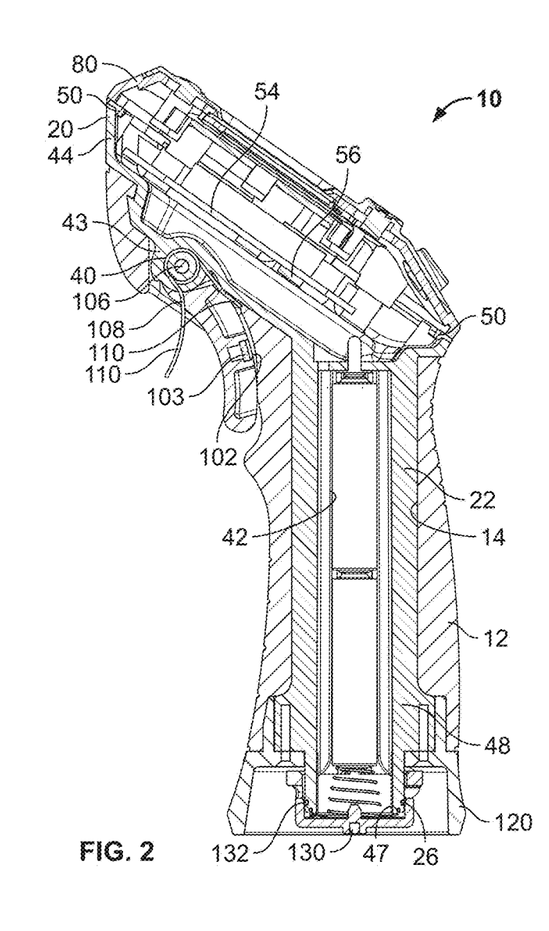
FIG. 2 is a side cross-sectional view of the wireless controller of FIG. 1 with the trigger of the controller depressed.

As shown in FIGS. 1-3, wireless controller 10 can also include a unique throttle mechanism. Controller 10 can use a wireless sensing arrangement as a throttle mechanism for controller actuation and speed control of a motor. For instance, the throttle mechanism described below can be used to control motor speed controller 107 of motor 105 of hydrofoil watercraft 100, as set forth in the '044 Patent.

Wireless controller 10 can include a wireless proximity sensor 56 (e.g., a magnetic field sensor like a Hall-effect sensor) positioned inside head 44 of housing 20, and a magnet 103 that can interact with sensor 56. Alternatively, another wireless proximity/distance sensor could be used in place of magnet 103 (e.g., an infrared sensor), or a mechanical sensor might be used (e.g., a variable resistor). Referring to FIGS. 1 and 3, magnet 103 can be disposed on a backside of a trigger 100, for example within a cavity 102 of trigger 100. In addition, trigger 100 can have a curved finger-gripping portion, and one or more (e.g., a plurality) of tabs 104 each with an opening arranged to accept a pin 106 for connecting trigger 100 to a portion of waterproof housing 20. For instance, as shown in FIG. 1, bottom surface 45 of head 44 of housing 20 can include a projection 43 with an opening that can receive pin 106. Tabs 104 of trigger 100 can straddle projection 43, and pin 106 can be inserted through the openings of tabs 104 and projection 43, such that trigger 100 can be squeezed and rotate about pin 106. Further, trigger can include a slot 108 for receiving a spring 110, and projection 43 can likewise include a slot 40 that receives spring 110. A portion of spring 110 can engage trigger 100 and waterproof housing 20, as shown in FIGS. 1-2, so that, as trigger 100 is squeezed or moved closer to handle 12, spring 110 is compressed. Upon release, spring 110 can then cause trigger 100 to return to its resting condition, as shown in FIG. 1.

In addition, when trigger 100 is compressed against the action of spring 110, magnet 103 can move closer in proximity to wireless proximity sensor 56 (e.g., Hall-effect sensor). This change of distance can be registered by sensor 56, and that information can be relayed to circuit board 54. In an example, if a Hall-effect sensor is used, as magnet 103 moves closer or farther away from Hall-effect sensor 56, Hall-effect sensor 56's output voltage can change in a predictable fashion. Circuit board 54 can include any necessary hardware to process and wirelessly transmit such information, including but not limited to a CPU (e.g., a processor), memory, and/or a wireless transmitter (e.g., a Bluetooth transmitter). The change of distance registered by sensor 56 (or alternatively change in voltage output in the case of a Hall-effect sensor) can be processed using the processor of circuit board 54 and software (e.g., a software application) running on the processor. For example, in the case of a Hall-effect sensor, the processor could use digital signal processing to process the change in voltage output of the Hall-effect sensor, and then run the resulting value through a software application to compute a certain output value for a motor that is wirelessly connected to controller 10. The resulting output value can then be wirelessly transmitted using the wireless transmitter associated with circuit board 54 to a motor speed controller for the motor. For example, the output value could be wirelessly transmitted to a wireless receiver coupled to motor speed controller 107 of the of hydrofoil watercraft 100, as set forth in the '044 Patent. In other words, the output value can be wirelessly transmitted to a wireless receiver that is coupled to motor speed controller 107, which can then use the output value information to change the output of motor 105 of watercraft 100. In this way, depressing trigger 100 can cause the output of a motor wirelessly coupled to controller 10 to increase, and releasing trigger 100 can cause the output of the motor to decrease. Such operation of wireless controller 10 is described in more detail below with respect to the method of use of controller 10.

Figure 5:
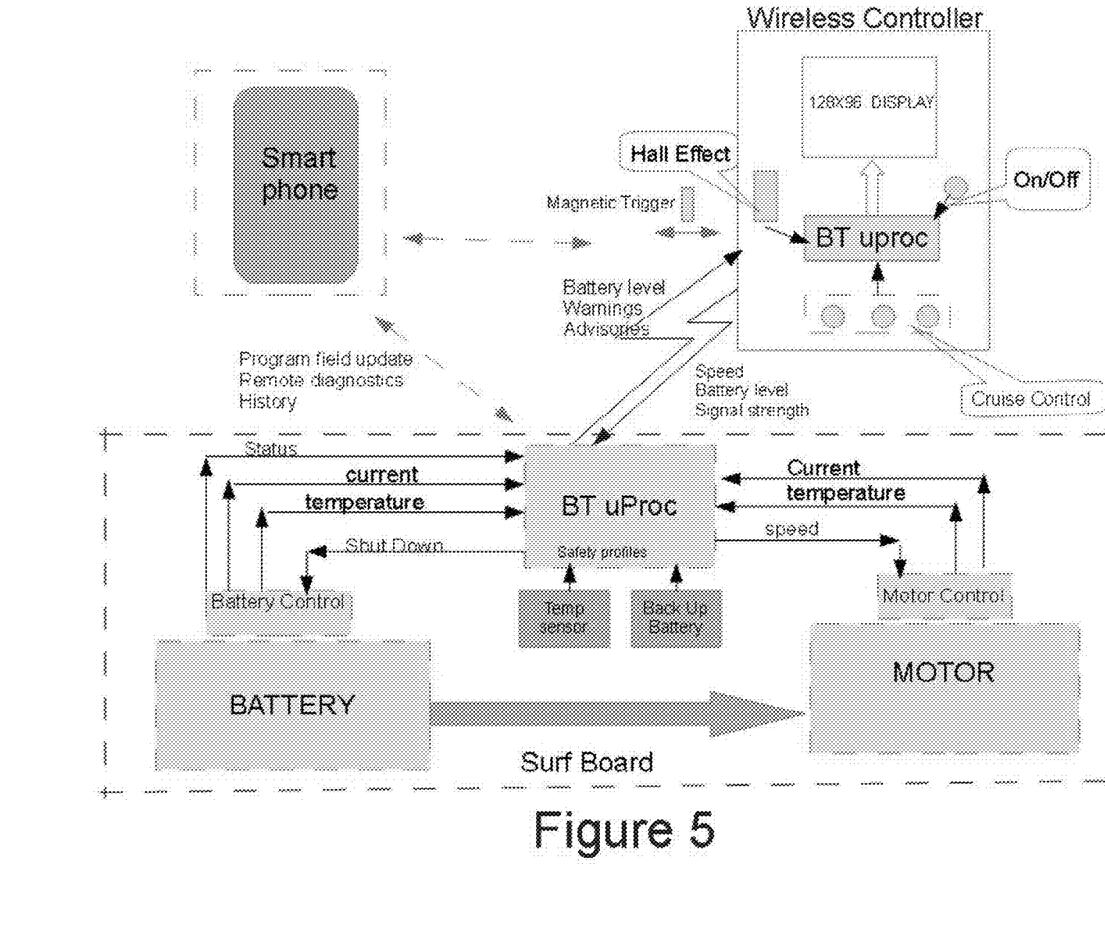
FIG. 5 is a schematic view of the controller, motor, and associated electronic components.

FIG. 5 illustrates a schematic exemplary view of controller 10's electronic components, the motor and its electronic components, and a smartphone. As shown, controller 10 can have a Bluetooth microprocessor that is coupled to display 62, sensor 56 (e.g., Hall-effect sensor), and magnet 103 that interacts with sensor 56. The motor, which can be motor 105 of the '044 Patent, can be coupled to a motor controller, a Bluetooth microprocessor, a battery, and a battery controller. In addition, the Bluetooth microprocessor can be coupled to a temperature sensor and/or a backup battery. As illustrated in FIG. 5, certain data can be exchanged between controller 10 and the motor, between the components of controller 10 itself, and between the components of the motor itself. As an example, data output from sensor 56 (e.g., Hall-effect sensor) can be sent to the Bluetooth microprocessor of controller 10, as shown, which can reflect such data in some capacity on display 62. Further, the Bluetooth microprocessor of controller 10 can transmit speed, battery level, and/or signal strength information to the Bluetooth microprocessor coupled to the motor, as illustrated. In the other direction, the Bluetooth microprocessor coupled to the motor can transmit battery level, warnings, and/or advisories to the Bluetooth microprocessor of controller 10. In addition, a cruise control button(s) can send cruise control data to the Bluetooth microprocessor of controller 10, as shown.

Still referring to FIG. 5, the motor controller can send electric current and/or temperature data to the Bluetooth microprocessor coupled to the motor, and the Bluetooth microprocessor can send speed data coming from controller 10 to the motor controller, which can cause a change in output of the motor as described above. The battery controller can send status information, electric current data, and/or temperature to the Bluetooth microprocessor and, as described in more detail below, the Bluetooth microprocessor can run a shutdown sub-routine in certain circumstances based off such data and/or certain safety profiles running on the microprocessor. Lastly, a smartphone can be coupled to the Bluetooth microprocessors of controller 10 and/or the motor to perform firmware updates (e.g., program field updates), run remote diagnostics, and/or retrieve historical information from the motor and/or controller 10.

In use, shaft 22 of waterproof housing 20 can be inserted into grip bore 14 of handle 12, and protrusions 24 on shaft 22 can ride within recesses or slots (not shown) inside grip bore 14. Shaft 22 can extend through grip bore 14, and distal end section 48 of shaft 22 can be inserted into bore 122 of cap 120, such that protrusions 24 engage with recesses 124 of cap 120. Further, cap 120 can be inserted into grip bore 14, either permanently or through a removable connection, such that protrusions 136 of cap 120 can engage with recesses or slots (not shown) in grip bore 14 of handle 12. Battery 30 (e.g., a rechargeable lithium ion battery or standard alkaline batteries) can be situated within bore 42 of shaft 22 of housing 20, and cap 130 can be attached to distal end section 48 of housing 20 in a water-tight manner. For instance, cap 130 can be connected to distal end section 48 of housing through a bayonet-type connection by inserting bayonet protrusions 49 into bayonet-slots 138 of cap 130, and then twisting cap 130. With cap 130 on shaft 22 of waterproof housing 20, water-tight seal 132 can engage with groove 26 of shaft 22 to create a water-tight arrangement between cap 130 and housing 20. Alternatively, other water-tight connections can be used.

Trigger 100 can be connected to waterproof housing 20 by arranging tabs 104 around projection 43 and inserting pin 106 through the openings thereof. Likewise, spring 110 can be engaged with trigger 100 and a portion of housing 20 so that trigger 100 can be resiliently depressed and spring back to its resting configuration, as shown in FIG. 1. Trigger can be depressed or squeezed to the position shown in FIG. 2. In addition, trigger 100 can extend through opening 16 in handle 12 so that, as trigger 100 is depressed and released, it does not interfere with handle 12. Magnet 103 can also be disposed inside trigger 100 so that, as trigger 100 is squeezed or released, magnet 103 moves closer or farther away from wireless proximity sensor 56.

The electronic components of controller 10 can be placed inside head 44 of waterproof housing 20 and sealed in a water-tight manner from the environment. For instance, circuit board 54 with wireless proximity sensor 56 (e.g., Hall-effect sensor) on its bottom can be arranged in head 44 of housing 20 and engaged with mount 58. Water-tight seal 50, which can be in the form of a rubber gasket, a thermoplastic gasket, or another seal, can be disposed on flange 34 of housing 20, and the openings of tabs 60 can be disposed over openings 52 of seal 50.

Digital display 62 can be attached to mount 58, with transparent cover 63 over digital display 62 and water-tight seal 64 ensuring that digital display 62 is protected from water intrusion. Faceplate 80 and button cover 88 can then be attached to waterproof housing 20 by inserting screws or other fixation members through openings 82, into and through the openings of tabs 60, into and through openings 52 in seal 50, and into openings 32 of housing 20. The screws or other fixation members can be tightened so that faceplate 80 is compressed towards housing 20 with water-tight seal 50 interposed therebetween to ensure a water-tight seal is formed along the entire perimeter of the interface between faceplate 80 and housing 20. In this way, all electronic components inside of waterproof housing 20 can be completely protected from water intrusion through the use of various water-tight seals.

Figure 4:
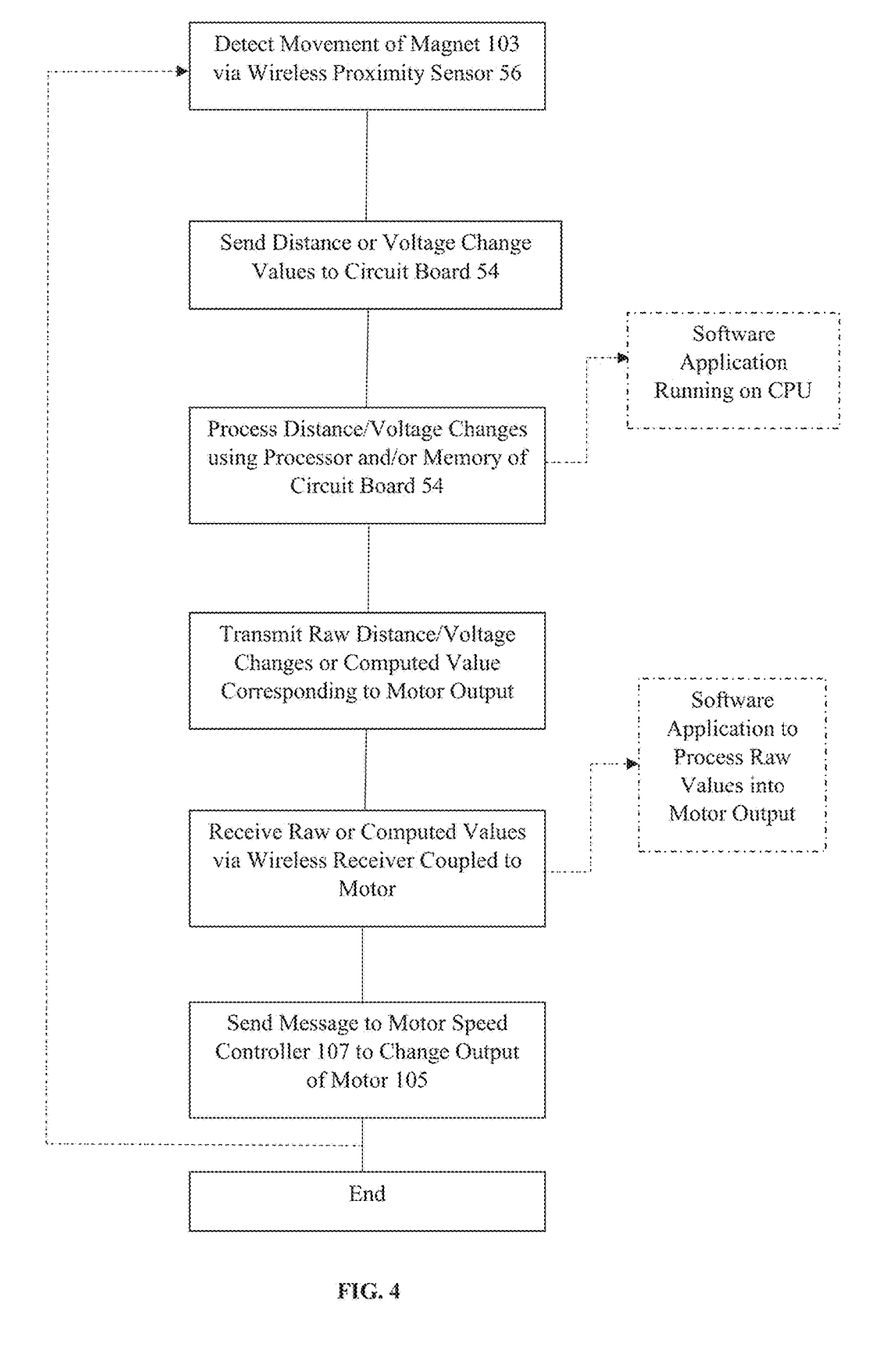
FIG. 4 is a flow chart illustrating an exemplary method of using the wireless controller of FIGS. 1-3 to control a motor.

As shown in FIGS. 1-2, a user can depress or release trigger 100 to cause a motor that is wirelessly coupled to controller 10 to increase or decrease its output. The output of the motor can increase or decrease in a manner that correlates to the movement of trigger 100, and thus magnet 103, towards and away from wireless proximity sensor 56 (e.g., Hall-effect sensor). FIG. 4 illustrates an exemplary flow chart setting forth the steps performed by controller 10 in this capacity, and FIG. 5 is a schematic view of the electronic components and/or messages exchanged during the process.

As shown in FIGS. 4-5, wireless proximity sensor 56 (e.g., Hall-effect sensor) can detect movement of magnet 103 towards or away from sensor 56. In the case of a Hall-effect sensor, as magnet 103 moves towards or away from sensor 56, it can cause an output voltage of Hall-effect sensor 56 to change (e.g., since the magnetic field changes). Of course, different Hall-effect sensors can output a digital representation of the sensed magnetic strength instead of a voltage. Other sensors could simply register the change in distance between sensor 56 and another component. For instance, an infrared sensor could be used as sensor 56, which could detect changes in distance as trigger 100 moves towards or away from sensor 56. In this example, a transparent screen might be present allowing the infrared sensor to detect trigger 100, or the infrared sensor might be operable through housing 20. The disclosure below discusses the use of a Hall-effect sensor for sensor 56, but it is to be understood that other wireless sensors might be used.

As trigger 100 and magnet 103 are moved toward and away from sensor 56, the voltage output thereof (in the case of a Hall-effect sensor) or the distance readings (in the case of other sensors) can be processed by the CPU of circuit board 54 and stored in memory. In the exemplary view of FIG. 5, the CPU is shown as a Bluetooth microprocessor. The voltage output readings or the distance readings can then either be transmitted as raw data via the wireless transmitter (e.g., Bluetooth transmitter/microprocessor of FIG. 5) of circuit board 54 to a wireless receiver (e.g., Bluetooth receiver/microprocessor of FIG. 5) coupled to a motor, or the voltage output/distance readings can be processed into a computed value that is sent to the wireless receiver. For instance, a software application running on the CPU of circuit board 54 can access the raw voltage output/distance readings from memory and process such readings into a computed value that is representative of a certain desired motor output. The CPU might use averaging and a form of outlier elimination (i.e., a form of regression analysis) to correlate certain voltage output/distance readings with a particular motor output value.

As shown in FIG. 4, the computed value corresponding to motor output can then be transmitted via the wireless transmitter of circuit board 54 to a wireless receiver coupled to a motor and/or a motor speed controller. For instance, the computed value corresponding to a certain motor output can be transmitted to a wireless receiver coupled to motor speed controller 107 of motor 105 of hydrofoil watercraft 100 of the '044 Patent. In FIG. 5, this is shown as the Bluetooth microprocessor of controller 10 sending speed data to the Bluetooth microprocessor coupled to the motor. The computed value corresponding to a certain motor output can then be sent to the motor speed controller (e.g. motor speed controller 107) of the motor (e.g., motor 105) to change the output of the motor in a predictable fashion. As an example, the computed value might be interpreted by hardware and software associated with the motor (e.g., a CPU, memory, associated software, etc.) to increase or decrease the output of the motor. As shown in FIG. 4, this process can repeat until the user stops using wireless controller 10 and its associated motor.

Alternatively, as shown in FIG. 4, raw voltage output/distance readings can be transmitted by way of the wireless transmitter of circuit board 54 to the wireless receiver coupled to the motor, and such raw values can then be processed into computed values at the location of the motor. Such processing can occur using the Bluetooth microprocessor of FIG. 5. This can involve a similar process as set forth above, except that computation occurs on a CPU coupled to the motor instead of the CPU of circuit board 54. In other words, using the '044 Patent as an example, hydrofoil watercraft 100 can have a CPU (e.g., a processor), memory, and a wireless receiver that receives raw voltage output/distance readings from the wireless transmitter of circuit board 54. Using FIG. 5 as an example, the CPU can be a Bluetooth microprocessor. Once the raw readings are received, they can be entered into memory, and the CPU of watercraft 100 can access and process such values into a computed value that corresponds to a certain motor 105 output. The computed value can be sent to motor speed controller 107 to cause motor 105 to change its output in a predictable fashion, similar to as described above. The CPU might use averaging and a form of outlier elimination (i.e., a form of regression analysis) to correlate certain voltage output/distance readings with a particular motor output value.

During use, controller 10 and its associated components can also provide for unique speed control and other functions. For example, as shown in FIG. 5, controller 10 can have a cruise control button(s) that, when triggered, sends a message to the Bluetooth microprocessor to set the speed/output of the motor to a certain level. As such, a user can set the motor output to a certain MPH (e.g., 10, 15, or 20 MPH), or to within a certain range MPH, Such information can be transmitted to the Bluetooth microprocessor coupled to the motor, as shown in FIG. 5.

Controller 10 can also include sub-routines for user safety. For example, as shown in FIG. 5, the Bluetooth microprocessor of controller 10 can continuously transmit signal strength information to the Bluetooth microprocessor coupled to the motor, and/or vice versa. In an example, when the signal strength falls below a certain threshold, the Bluetooth microprocessor of controller 10 can run an application or safety sub-routine that causes the Bluetooth microprocessor coupled to the motor to send a message to the motor speed controller to reduce the speed output of the motor, or shut off the motor completely. In this way, when the signal strength is reduced to below an acceptable level or is lost altogether, which can occur is a user fails of the watercraft or drops controller 10, the motor output can be reduced or shut off completely for user safety. In an alternate example, the Bluetooth microprocessor of controller 10 and/or the motor can expect to receive data packets on a regularly timed basis. If a certain number of data packets is not received over a certain time interval, an assumption can be made that the wireless link between controller 10 and the motor has been disrupted or is failing. This can occur if a user falls off the watercraft or drops controller 10 in the water. In this case, the Bluetooth microprocessor of controller 10 and/or the motor can run a re-connect sub-routine/application to attempt to reconnect the wireless link as quickly as possible. During this period, any buttons or trigger outputs from controller 10 can disabled from being read by the Bluetooth microprocessor of controller 10, and/or the Bluetooth microprocessor of the motor can transmit a message to the motor controller of the motor to reduce or completely shut off its output. In this way, controller 10 can ensure that the watercraft does not continue to run when, for example, the user falls off the watercraft, accidentally drops controller 10 in the water, or some other safety event occurs.

The smartphone of FIG. 5 can be used to provide firmware updates to controller 10 and/or the motor coupled thereto. In an example, a firmware update can be provided to the Bluetooth microprocessor of controller 10 and/or the motor, which provides an application for setting different user restrictions or profiles for the watercraft. For instance, an application can be provided for running on the Bluetooth microprocessor of controller 10 and/or the motor that sets different user-experience profiles (e.g., experienced user, intermediate user, and beginner user). Based off such profiles, the performance of controller 10 and/or the motor can be altered. For instance, an experienced user profile can have different settings for actuation of trigger 100 using controller 10, and/or also the output of the motor. The experienced user profile can allow for faster acceleration using trigger 100 of controller 10, and/or also maximum motor output for the motor. By contrast, the beginner user profile can have settings that provide for slower acceleration when trigger 100 of controller 10 is actuated (as compared to the experienced user profile), and/or also lower output of the motor. For instance, although the motor can have a maximum output capacity, with the beginner profile, the output settings for the motor can be reduced to below the maximum output capacity so that the beginner user is not able to travel too fast on the watercraft. Thus, different user profiles or settings can be provided and changed at will using the smartphone.

As such, using the wireless sensor mechanisms disclosed herein (e.g., Hall-effect sensor, IR sensor, etc.), the water-tight nature of controller 10 can be preserved and proper throttle control for watercraft 100 of the '044 Patent can be achieved. In certain prior art systems, any trigger mechanism might penetrate the body of the controller and provide an entry point for water. Thus, such throttle mechanisms are not suitable for use in or around water as damage can easily occur. The present controller 10 provides a unique sensor and trigger mechanism in addition to unique waterproofing characteristics to ensure that controller 10 is usable in or around water without any water intrusion or damage occurring.

Although the use of a wireless transmitter and wireless receiver is disclosed above, it is contemplated that instead a pair of wireless transceivers can be used. Thus, controller 10 might include a wireless transceiver and the motor coupled to controller 10 might also include a transceiver that is capable of communicating with the transceiver of controller 10 in the same manner as discussed above. As such, data could be exchanged between the transceivers in the manner disclosed above to change the output of the motor. This can also be advantageous as data from the motor and/or any associated components can be sent back to controller 10 so that a user can be apprised of the state of the motor and/or any associated components (e.g., failure warnings, speed, battery level of any battery associated with the motor, etc.)

It will be readily understood to those skilled in the art that various other changes in the details, material, and arrangements of the parts and method stages which have been described and illustrated in order to explain the nature of the inventive subject matter can be made without departing from the principles and scope of the inventive subject matter as expressed in the subjoined claims. For example, the order of method steps or stages can be altered from that described above, as would be appreciated by a person of skill in the art.

It will also be appreciated that the various dependent claims, examples, and the features set forth therein can be combined in different ways than presented above and/or in the initial claims. For instance, any feature(s) from the above examples can be shared with others of the described examples, and/or a feature(s) from a particular dependent claim may be shared with another dependent or independent claim, in combinations that would be understood by a person of skill in the art.

What is claimed is:

1. A wireless controller comprising:
   a housing with a water-tight cavity;
   a computer comprising a processor and a memory disposed inside of the water-tight cavity;
   a plurality of user profiles;
   a wireless transmitter coupled to the computer; and
   a throttle mechanism comprising a sensor coupled to the computer and a trigger, wherein the sensor is disposed inside of the water-tight cavity and the trigger is disposed outside of the water-tight cavity, the sensor being configured to wirelessly detect movement of the trigger, wherein the computer is configured to:
   receive a first signal corresponding to movement of the trigger relative to the sensor; and in response to the first signal, direct the wireless transmitter to transmit a second signal configured to change the output of a motor that is wirelessly coupled to the wireless controller;

wherein the housing is configured to cover the computer, the wireless transmitter and the sensor, thereby enclosing such components within the water-tight cavity; and wherein the computer is further configured to limit the performance of the motor based on the plurality of user profiles.

2. The wireless controller of claim 1, wherein the sensor is a Hall-effect sensor, and the trigger includes a magnet.

3. The wireless controller of claim 2, wherein movement of the magnet relative to the Hall-effect sensor produces a first signal.

4. The wireless controller of claim 1, wherein the sensor is a Hall-effect sensor or an infrared sensor.

5. The wireless controller of claim 1, wherein the housing comprises a first part mated to a second part with a water-tight seal interposed between the first part and the second part, the water-tight seal forming a waterproof barrier that creates the water-tight cavity.

6. The wireless controller of claim 5, wherein the first and second parts mate along an interface perimeter, and the water-tight seal extends between the first and second parts along and entirety of the interface perimeter.

7. The wireless controller of claim 1, wherein the housing includes a shaft and the wireless controller further comprises a cap that is sealed to the shaft by way of a water-tight seal.

8. The wireless controller of claim 1, wherein the computer is further configured to:

receive the first signal corresponding to movement of the trigger relative to the sensor and compute a motor output value; and direct the wireless transmitter to transmit the motor output value to the motor that is wirelessly coupled to the wireless controller, wherein the motor output value is configured to change the output of the motor.

9. The wireless controller of claim 1, further comprising:

wherein the computer is further configured to receive signal strength information from the wireless transmitter, and in response to signal strength information below a signal strength threshold, shutting off the motor that is wirelessly coupled to the wireless controller.

10. A method of operating a waterproof controller comprising:

providing a waterproof controller comprising:
- a housing with a water-tight cavity;
- a plurality of user profiles;
- a computer having a processor and a memory disposed in the water-tight cavity; and
- a throttle mechanism comprising a sensor coupled to the computer and a trigger, wherein the sensor is disposed inside of the water-tight cavity and the trigger is disposed outside of the water-tight cavity;

wirelessly detecting movement of the trigger by way of the sensor, moving the trigger relative to the sensor, thereby causing the sensor to send a first signal to the computer;

in response to the first signal, transmitting a second signal via a wireless transmitter to a receiver coupled to a motor;

changing an output of the motor in response to the second signal; and limiting the performance of the motor based on the plurality of user profiles, wherein the housing is configured to cover the computer, the wireless transmitter, the sensor, and the wireless transmitter, thereby enclosing such components within the watertight cavity.

11. The method of claim 10, wherein the sensor is a Hall-effect sensor, and the trigger includes a magnet.

12. The method of claim 11, further comprising moving the magnet relative to the Hall-effect sensor, thereby causing the Hall-effect sensor to send the first signal to the computer.

13. The method of claim 10, wherein the sensor is a Hall-effect sensor or an infrared sensor.

14. The method of claim 10, wherein the housing comprises a first part mated to a second part with a water-tight seal interposed between the first part and the second part, the water-tight seal forming a waterproof barrier that creates the water-tight cavity.

15. The method of claim 14, wherein the first and second parts mate along an interface perimeter, and the water-tight seal extends between the first and second parts along an entirety of the interface perimeter.

16. The method of claim 10, wherein the housing includes a shaft and the wireless controller further comprises a cap that is sealed to the shaft by way of a water-tight seal.

17. A wireless waterproof controller comprising;
- a housing with a water-tight cavity;
- a plurality of user profiles;
- a computer comprising a processor and a memory disposed inside of the water-tight cavity;
- a wireless transmitter coupled to the computer; and
- a throttle mechanism comprising a Hall-effect sensor coupled to the computer and a trigger having a magnet, wherein the hall effect sensor is disposed inside of the water-tight cavity and the trigger and magnet are disposed outside of the water-tight cavity, the Hall-effect sensor being configured to wirelessly detect movement of the trigger when the magnet is moved relative to the Hall-effect sensor, wherein the computer is configured to:

receive a first signal corresponding to movement of the trigger and magnet relative to the Hall-effect sensor; and in response to the first signal, direct the wireless transmitter to transmit a second signal configured to change the output of a motor that is wirelessly coupled to the wireless controller;

wherein the housing is configured to cover the computer, the wireless transmitter and the Hall-effect sensor, thereby enclosing such components within the water-tight cavity; and wherein the computer is further configured to limit the performance of the motor based on the plurality of user profiles.

18. The wireless controller of claim 17, wherein the housing comprises a first part mated to a second part with a water-tight seal interposed between the first part and the second part, the water-tight seal forming a waterproof barrier that creates the water-tight cavity.

19. The wireless controller of claim 18, wherein the first and second parts mate along an interface perimeter, and the water-tight seal extends between the first and second parts along an entirety of the interface perimeter.

20. The wireless controller of claim 17, wherein the housing includes a shaft and the wireless controller further comprises a cap that is sealed to the shaft by way of a water-tight seal.

* * * * *